US009252374B2

(12) United States Patent
Seok et al.

(10) Patent No.: US 9,252,374 B2
(45) Date of Patent: Feb. 2, 2016

(54) METHOD FOR MANUFACTURING HIGH-EFFICIENCY INORGANIC-ORGANIC HYBRID SOLAR CELL

(71) Applicant: KOREA RESEARCH INSTITUTE OF CHEMICAL TECHNOLOGY, Daejeon (KR)

(72) Inventors: Sang Il Seok, Daejeon (KR); Sang Hyuk Im, Daejeon (KR); Jun Hong Noh, Daejeon (KR); Jin Hyuck Heo, Busan (KR)

(73) Assignee: KOREA RESEARCH INSTITUTE OF CHEMICAL TECHNOLOGY, Daejeon (KR)

( * ) Notice: Subject to any disclaimer, the term of this patent is extended or adjusted under 35 U.S.C. 154(b) by 0 days.

(21) Appl. No.: 14/759,744

(22) PCT Filed: Jan. 10, 2014

(86) PCT No.: PCT/KR2014/000337
§ 371 (c)(1),
(2) Date: Jul. 8, 2015

(87) PCT Pub. No.: WO2014/109610
PCT Pub. Date: Jul. 17, 2014

(65) Prior Publication Data
US 2015/0349282 A1 Dec. 3, 2015

(30) Foreign Application Priority Data
Jan. 10, 2013 (KR) .................. 10-2013-0003129

(51) Int. Cl.
*H01L 21/00* (2006.01)
*H01L 51/42* (2006.01)
*H01L 51/00* (2006.01)
*H01G 9/20* (2006.01)

(52) U.S. Cl.
CPC .......... *H01L 51/4226* (2013.01); *H01G 9/2031* (2013.01); *H01L 51/0003* (2013.01); *H01L 2251/10* (2013.01)

(58) Field of Classification Search
CPC .................. H01L 51/4226; H01L 51/0003
See application file for complete search history.

(56) References Cited

U.S. PATENT DOCUMENTS 6,384,321 B1 * 5/2002 Mikoshiba et al. ........... 136/263
9,181,475 B2 * 11/2015 Kanatzidis et al.

FOREIGN PATENT DOCUMENTS

JP        2001-156307 A    6/2001
KR        101116250 B1     3/2012
(Continued)

OTHER PUBLICATIONS

International Search Report Appln. No. PCT/KR2014/000337; Dated Apr. 21, 2014.
(Continued)

*Primary Examiner* — Richard Booth
(74) *Attorney, Agent, or Firm* — Ladas & Parry LLP

(57) ABSTRACT

Provided is a method for manufacturing a solar cell including: a) forming an electron transport layer on a first electrode; b) forming a light absorber by applying a light absorber solution as a solution for forming a light absorber containing an organic-metal halide having a perovskite structure, the light absorber solution containing an organic halide and a metal halide dissolved therein so as to have a non-stoichiometric ratio based on the organic-metal halide; c) forming a hole conduction layer by applying and drying a hole transport solution in which an organic hole transport material is dissolved; and d) forming a second electrode, which is a counter electrode of the first electrode, on the hole conduction layer.

8 Claims, 1 Drawing Sheet

(56) References Cited

FOREIGN PATENT DOCUMENTS

| | | |
|---|---|---|
| KR | 101168227 B1 | 7/2012 |
| KR | 101172374 B1 | 8/2012 |
| WO | 2014042447 A1 | 3/2014 |
| WO | 2014042449 A2 | 3/2014 |

OTHER PUBLICATIONS

Sang Hyuk Im et al, "Toward Interaction of Sensitizer and Fuctional Moieties in Hole-Transporting Materials for Efficient Semiconductor-Sensitized Solar Cells", Nano Letters, Sep. 2011, vol. No. 11, pp. 4789-4793.

Zhicai He et al, "Simulataneous Enhancement of Open-Circuit Voltage, Short-Circuit Current Density, and Fill Factor in Polymer Solar Cells", Advanced Materials, Sep. 2011, vol. No. 23, pp. 4636-4643.

Aswani Yella et al, "Porphyrin-Sensitive Solar Cells with Cobalt (II, III)-Based Redox Electrolyte Exceed 12 Percent Efficiency", Science Mag, Corrected Dec. 2011, vol. No. 334. pp. 629-634.

\* cited by examiner

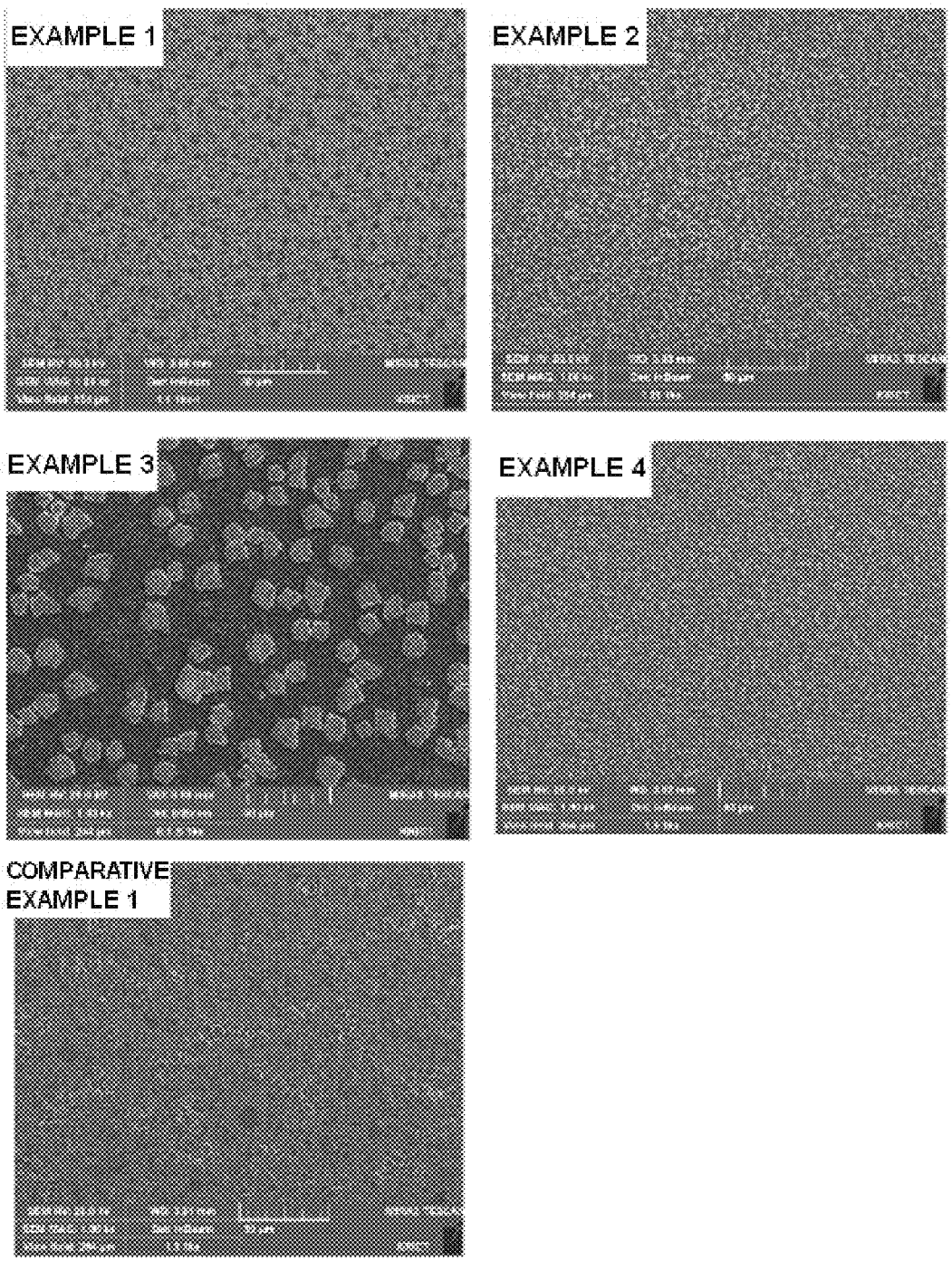

METHOD FOR MANUFACTURING HIGH-EFFICIENCY INORGANIC-ORGANIC HYBRID SOLAR CELL

TECHNICAL FIELD

The present invention relates to a method for manufacturing an inorganic-organic hybrid solar cell, and more particularly, to a method for manufacturing a solar cell that may be mass-produced at low cost by a significantly simple process while having excellent photoelectric conversion efficiency.

BACKGROUND ART

In order to solve depletion of fossil energy and earth-environmental problems caused by using fossil energy, research into alternative clean energy sources such as solar energy, wind energy, and hydro energy that are recyclable and clean has been actively conducted.

Among them, an interest in a solar cell directly converting solar light into electric energy has significantly increased. Here, the solar cell means a cell generating current-voltage using a photovoltaic effect that the cell absorbs light energy from the solar light to generate electrons and holes.

Currently, an n-p diode type single-crystalline silicon (Si) based solar cell having photoenergy conversion efficiency higher than 20% may be manufactured and actually used in solar power conversion, and there is a solar cell using a compound semiconductor such as gallium arsenide (GaAs) having conversion efficiency higher than that of the n-p diode type single-crystalline silicon (Si) based solar cell. However, since these inorganic semiconductor based solar cells require a very highly purified material for high efficiency, a large amount of energy is consumed in purifying a raw material, and expensive processing equipment is required during a single crystallization process or a thinning process using the raw material, such that there is a limitation in lowering manufacturing cost of the solar cell, thereby blocking large-scale use of the solar cell.

Therefore, in order to manufacture the solar cell at low cost, cost of a core material used in the solar cell or the manufacturing process of the solar cell should be greatly reduced, and research into a dye-sensitized solar cell (DSSC) and an organic solar cell that may be manufactured using an inexpensive material and process has been actively conducted as an alternative to the inorganic semiconductor based solar cell.

However, in the case of an organic solar cell using a conductive polymer, efficiency is still about 8% (Advanced Materials, 23 (2011) 4636), and in the dye-sensitized solar cell, in the case of using a liquid electrolyte, the maximum efficiency is about 12 to 13% (Science 334, (2011) 629), and in the case of using a solid type hole conductor, efficiency is still low (7 to 8%). Even in the case of an inorganic-organic hybrid solar cell in a form in which inorganic semiconductor nanoparticles and a hole conductive polymer are coupled in a structure of the dye-sensitized solar cell, efficiency thereof is still about 6% (Nano Letters, 11 (2011) 4789).

Therefore, the development of a solar cell capable of having excellent efficiency enough to replace the single-crystalline silicon (Si) based solar cell according to the related art has been urgently demanded.

DISCLOSURE

Technical Problem

An object of the present invention is to provide a method capable of easily forming a light absorption structure body. Therefore, an object of the present invention is to provide a method for manufacturing a solar cell having a light absorption structure body capable of being mass-produced at low cost by a very simple process while having excellent photoelectric conversion efficiency. More particularly, an object of the present invention is to provide a method capable of more easily adjusting the light absorption structure body. Further, another object of the present invention is to provide a method for manufacturing an inorganic-organic hybrid solar cell having a high efficiency light absorption structure body through a significantly simple method of coating a light absorber precursor in a liquid phase on a porous (photo) electrode and drying a solvent to form a light absorber.

Technical Solution

In one general aspect, a method for manufacturing a solar cell includes: a) forming an electron transport layer on a first electrode; b) forming a light absorber by applying a light absorber solution as a solution for forming a light absorber containing an organic-metal halide having a perovskite structure, the light absorber solution containing an organic halide and a metal halide dissolved therein so as to have a non-stoichiometric ratio based on the organic-metal halide; c) forming a hole conduction layer by applying and drying a hole transport solution in which an organic hole transport material is dissolved; and d) forming a second electrode, which is a counter electrode of the first electrode, on the hole conduction layer.

Preferably, step a) may include forming a porous metal oxide layer on the first electrode, and step b) may include applying and drying the light absorber solution on the porous metal oxide layer to form a composite layer in which the light absorber is impregnated into the porous metal oxide layer and a light absorption structure body extended from the composite layer and made of the light absorber, wherein a shape of the light absorption structure body is controlled by a molar ratio of the organic halide and the metal halide contained in the light absorber solution.

That is, the method for manufacturing a solar cell according to the present invention may include: forming a porous metal oxide layer on a first electrode to manufacture a porous electrode (meaning a structure including the first electrode and the porous metal oxide layer); forming a composite layer and a light absorption structure body by applying and drying a light absorber solution as a solution for forming a light absorber containing an organic-metal halide having a perovskite structure on the porous electrode, the light absorber solution containing an organic halide and a metal halide dissolved therein so as to have a non-stoichiometric ratio based on the organic-metal halide; forming a hole conduction layer by applying and drying a hole transport solution in which an organic hole transport material is dissolved on the porous electrode provided with light absorber; and forming a second electrode, which is a counter electrode of the first electrode, on the hole conduction layer, wherein a shape of the light absorption structure body may be controlled by a molar ratio of the organic halide and the metal halide contained in the light absorber solution.

In the method for manufacturing a solar cell according to an exemplary embodiment of the present invention, in step b), the porous metal oxide layer impregnated with the light absorber, that is, the composite layer may be formed.

In the method for manufacturing a solar cell according to an exemplary embodiment of the present invention, in step b), the porous metal oxide layer impregnated with the light absorber, that is, the composite layer, and the light absorption structure body, that is, a light absorber pillar extended and protruding from the composite layer may be formed.

In the method for manufacturing a solar cell according to an exemplary embodiment of the present invention, in step b), the porous metal oxide layer impregnated with the light absorber, that is, the composite layer, and the light absorption structure body, that is, a light absorber thin film extended from the composite layer may be formed.

In the method for manufacturing a solar cell according to an exemplary embodiment of the present invention, the shape of the light absorption structure body may be controlled by the molar ratio of the organic halide and the metal halide contained in the light absorber solution.

In the method for manufacturing a solar cell according to an exemplary embodiment of the present invention, a size of the light absorption structure body may be controlled by the molar ratio of the organic halide and the metal halide contained in the light absorber solution.

In the method for manufacturing a solar cell according to an exemplary embodiment of the present invention, the organic halide may satisfy Chemical Formula 2, and the metal halide may satisfy Chemical Formula 3.

$$AX \quad \text{(Chemical Formula 2)}$$

In Chemical Formula 2, A is a monovalent organic ammonium ion, a monovalent ammonium ion, or $Cs^+$, and X is a halogen ion.

$$MX_2 \quad \text{(Chemical Formula 3)}$$

In Chemical Formula 3, M is a divalent metal ion, and X is a halogen ion.

In the method for manufacturing a solar cell according to an exemplary embodiment of the present invention, the non-stoichiometric ratio may satisfy the following Correlation Equation 1.

$$1 < M_o/M_m \le 1.5 \quad \text{(Correlation Equation 1)}$$

In Correlation Equation 1, $M_o$ is a mole number of the organic halide contained in the light absorber solution, and $M_m$ is a mole number of the metal halide contained in the light absorber solution.

In the method for manufacturing a solar cell according to an exemplary embodiment of the present invention, the non-stoichiometric ratio may satisfy the following Correlation Equation 2.

$$1 < M_o/M_m < 1.25 \quad \text{(Correlation Equation 2)}$$

In Correlation Equation 1, $M_o$ is a mole number of the organic halide contained in the light absorber solution, and $M_m$ is a mole number of the metal halide contained in the light absorber solution.

In the method for manufacturing a solar cell according to an exemplary embodiment of the present invention, step a) may further include forming the first electrode on a rigid substrate or flexible substrate.

The method for manufacturing a solar cell according to an exemplary embodiment of the present invention may further include, after step a) and before step b), forming a metal oxide thin film on the first electrode.

In the method for manufacturing a solar cell according to an exemplary embodiment of the present invention, application of the light absorber solution may be performed by spin coating.

In the method for manufacturing a solar cell according to an exemplary embodiment of the present invention, application of the light absorber solution may be performed at least two times by spin coating.

Advantageous Effects

The method for manufacturing a solar cell according to the present invention may control a structure of a light absorber by a significantly simple and easy method of controlling a molar ratio of a metal halide and an organic halide in a light absorber solution and manufacture a solar cell having significantly high efficiency.

DESCRIPTION OF DRAWINGS

FIG. 1 is optical microscope photographs obtained by forming a light absorber on a porous metal oxide layer in Examples 1 to 4 and Comparative Example 1 and then observing a surface thereof.

BEST MODE

Hereinafter, a method for manufacturing a solar cell according to the present invention will be described in detail with reference to the accompanying drawings. The following accompanying drawings are provided by way of example so that the idea of the present invention can be sufficiently transferred to those skilled in the art to which the present invention pertains. Therefore, the present invention is not limited to the drawings to be provided below, but may be modified in many different forms. In addition, the drawings to be provided below may be exaggerated in order to clarify the idea of the present invention. Here, technical terms and scientific terms used in the present specification have the general meaning understood by those skilled in the art to which the present invention pertains unless otherwise defined, and a description for the known function and configuration unnecessarily obscuring the gist of the present invention will be omitted in the following description and the accompanying drawings.

The method for manufacturing a solar cell includes: a) forming an electron transport layer on a first electrode; b) forming a light absorber by applying a light absorber solution as a solution for forming a light absorber containing an organic-metal halide having a perovskite structure, the light absorber solution containing an organic halide and a metal halide dissolved therein so as to have a non-stoichiometric ratio based on the organic-metal halide; c) forming a hole conduction layer by applying and drying a hole transport solution in which an organic hole transport material is dissolved; and d) forming a second electrode, which is a counter electrode of the first electrode, on the hole conduction layer. Preferably, step a) includes forming a porous metal oxide layer on the first electrode, and step b) includes applying and drying the light absorber solution on the porous metal oxide layer to form a composite layer in which the light absorber is impregnated into the porous metal oxide layer and a light absorption structure body extended from the composite layer and made of the light absorber, wherein a shape of the light absorption structure body may be controlled by a molar ratio of the organic halide and the metal halide contained in the light absorber solution.

In the solar cell according to an exemplary embodiment of the present invention, the electron transport layer may be made of an inorganic material and contain a metal oxide. The electron transport layer may be a flat metal oxide layer, a metal oxide layer having surface unevenness, a metal oxide layer having a composite structure in which a homogeneous or heterogeneous metal oxide nanostructure (including a metal oxide nanowire and/or nanotube) is formed on a surface of a metal oxide layer in a thin film shape, or a porous metal oxide layer. Preferably, the electron transport layer may be a porous metal oxide layer having a porous structure due to metal oxide particles. The metal oxide layer having surface unevenness may include uneven portions formed on a surface of the metal oxide layer by physical force such as artificial scraping and include uneven portions formed on the surface of the metal oxide layer by thermal and/or chemical etching (artificial partial etching). Further, surface unevenness is not to be construed as being limited to simply have high surface roughness. As an example, surface unevenness should also be construed to include the case in which an uneven structure is artificially formed on the surface of the metal oxide layer using an etching mask at the time of chemical etching.

When an electron transport layer having a predetermined thickness is assumed, a preferable structure capable of increasing a contact interfacial area with the light absorber and smoothly transporting electrons is formed in the case in which the electron transport layer is the porous metal oxide layer. Therefore, a structure mainly including the porous metal oxide layer, which is particularly preferable as the electron transport layer, and including the first electrode provided with the porous metal oxide layer is referred to as a porous electrode, and preferable solar cells according to exemplary embodiments of to the present invention will be described. In this case, the porous metal oxide layer may contain metal oxide particles, and have an open porous structure by void spaces between these particles.

The method for manufacturing a solar cell according to the present invention includes: a) forming a porous metal oxide layer on a first electrode to manufacture a porous electrode; b) forming a composite layer and a light absorption structure body by applying and drying a light absorber solution as a solution for forming a light absorber containing an organic-metal halide (an inorganic/organic hybrid perovskite compound) having a perovskite structure on the porous electrode, the light absorber solution containing an organic halide and a metal halide dissolved therein so as to have a non-stoichiometric ratio based on the organic-metal halide; c) forming a hole conduction layer by applying and drying a hole transport solution in which an organic hole transport material is dissolved on the composite layer or porous electrode provided with light absorber; and d) forming a second electrode, which is a counter electrode of the first electrode, on the hole conduction layer.

In the method for manufacturing a solar cell according to an exemplary embodiment of the present impregnated with the light absorber, that is, the composite layer may be formed.

In the method for manufacturing a solar cell according to an exemplary embodiment of the present invention, in step b), the composite layer, which is the porous metal oxide layer impregnated with the light absorber and the light absorption structure body, which is a light absorber pillar extended and protruding from the composite layer, a light absorber film extended from the composite layer, or a light absorber film extended from the composite layer and provided with light absorber pillars, may be formed.

As described above, in the method for manufacturing a solar cell, as the organic-metal halide (inorganic/organic hybrid perovskite compound) having a perovskite structure is contained as the light absorber, the light absorption may be formed by simply applying and drying the light absorber solution, and the composite layer, which is the porous metal oxide layer impregnated with the light absorber or the light absorption structure body, including the pillar formed by extension and protrusion of the light absorber from a surface of the composite layer is formed, such that efficiency of the solar cell may be improved.

In detail, the light absorber absorbing light to generate a pair of photo-hole and photo-electron is present in the composite layer and/or the light adsorption structure body. Due to this structure, a light absorption region in which the light absorber absorbs light to generate the pair of photo-hole and photo-electron in the solar cell may be increased. Further, the photo-electron generated in the light absorber may be smoothly and effectively separated and moved due to a wide contact area between the porous electrode serving as an electron carrier or a supporter of the light absorber and the light absorber. Further, in the case in which the light absorption structure body is extended from the composite layer to thereby be formed integrally with the composite layer, the photo-hole generated in the light absorber may be moved in a predetermined direction, that is, a direction toward the second electrode by the pillar protruding and extended from the composite layer, and movement toward a plane parallel with the electrode (second electrode) is minimized, such that the photo-hole may be effectively moved, and a loss by recombination may be prevented. Further, in the case in which the light absorption structure body is the pillar, the contact area between the hole transport material and the light absorber is increased by unevenness caused by the pillar, such that photo-hole may be effectively separated, and effective movement of the photo-hole may be secured. Further, in the case in which the light absorption structure body is the film, the light absorber has an increased photoactive region in which solar lights to be irradiated may be entirely absorbed, and annihilation by a smooth flow and recombination of the photo-hole and the photo-electron may be prevented, such that efficiency may be improved.

In the method for manufacturing a solar cell according to an exemplary embodiment of the present invention, the shape and/or a size of the light absorber may be controlled by the molar ratio of the organic halide and the metal halide dissolved in the light absorber solution. More specifically, in the case in which the light absorption structure body includes the light absorber pillar, a shape and/or a size of the pillar may be controlled, and in the case in which the light absorption structure body includes the light absorber film, denseness and/or a thickness of the film may be controlled.

In order to assist in the clear understanding of the present invention, a solar cell manufactured by the method for manufacturing a solar cell according to the present invention will be described before the method for manufacturing a solar cell according to the present invention is described.

The solar cell manufactured by the method for manufacturing a solar cell according to the present invention includes a composite layer in which a light absorber is impregnated into a porous electrode, more specifically, a porous metal oxide layer of the porous electrode; a hole conduction layer positioned on the composite layer; and a second electrode positioned on the hole conduction layer. In this case, the light absorption structure body having a shape of the light absorber pillar extended from the composite layer, the light absorption film, or the light absorber film provided with the light absorber pillar may be positioned between the composite layer and the hole conduction layer.

That is, the solar cell manufactured by the method for manufacturing a solar cell according to an exemplary embodiment of the present invention may include the composite layer in which the light absorber is impregnated into the porous electrode; the light absorption structure body having a shape of the light absorber pillar positioned on the composite layer and extended from the composite layer, the light absorber film, or the light absorber film provided with the light absorber pillar; the hole conduction layer positioned on the light absorption structure body; and the second electrode positioned on the hole conduction layer.

In this case, the porous electrode may include the porous metal oxide layer formed on the first electrode and have a porous structure due to the porous metal oxide layer, wherein the porous metal oxide layer may serve as an electron carrier and/or a supporter of the light absorber.

That is, the solar cell manufactured by the method for manufacturing a solar cell according to an exemplary embodiment of the present invention may include: the composite layer including the porous metal oxide layer serving as the electron carrier or the supporter of the light absorber and the light absorber; and the light absorption structure body extended from the composite layer and positioned on the composite layer, wherein the light absorption structure body may have a structure of the light absorber pillar, the light absorber film, or the light absorption film provided with the light absorber pillar.

The composite layer may include the porous metal oxide layer formed on the first electrode and the light absorber positioned in pores of the metal oxide layer and have a structure in which a film made of the light absorber encloses a surface including a surface by the pores of the metal oxide layer and a structure in which the pores of the metal oxide layer are filled with the light absorber.

In the solar cell manufactured by the method for manufacturing a solar cell according to an exemplary embodiment of the present invention, the light absorption structure body may have a structure extended from the composite layer. The extension structure as described above may mean a structure in which the light absorber contained in the composite layer and the light absorption structure body are integrated with each other. In detail, the light absorption structure body may be formed simultaneously with the light absorber contained in the composite layer by applying the light absorber solution once in step b), or the light absorption structure body extended from the composite layer may be formed on the composite layer after forming the composite layer by applying the light absorber solution several times in step b). That is, the above-mentioned extension structure may mean a structure in which one end of the pillar is coupled to the composite layer, a structure in which the light absorption structure body and the composite layer are integrated with each other, a structure in which the light absorption structure body and the light absorber contained in the composite layer are integrated with each other, a structure in which the light absorption structure body is formed by growth from the composite layer, and a structure in which the light absorption structure body is formed by growth from the light absorber contained in the composite layer.

As described above, as the light absorption structure body has the structure extended from the composite layer, in the case in which the light absorption structure body includes the pillar, the pillar may have a structure in which one end thereof is buried in the composite layer. That is, as the light absorption structure body is formed simultaneously with the light absorber contained in the composite layer by a single process or grows from the light absorber contained in the composite layer, one end of the pillar adjacent to the light absorber may be positioned in the surface of the light absorber or into the light absorber, and the other end of the pillar may protrude upwardly from the surface of the light absorber to form a protrusion structure such as an island. The structure in which one end of the pillar is buried in the light absorber may improve separation and movement efficiency of photo-charges generated in the light absorption structure body.

The size and/or the shape of the pillar as described above may affect movement efficiency of the photo-hole through the pillar, interfacial resistance between the pillar and the hole transport layer, a contact area between the pillar and the hole transport layer, and the like.

In the method for manufacturing a solar cell according to the present invention, the size and/or the shape of the pillar or denseness and/or the thickness of the film may be adjusted by controlling the molar ratio of the organic halide and the metal halide in the light absorber solution for forming the light absorber containing the organic-metal halide having the perovskite structure so as to be deviated from a stoichiometric ratio of the organic-metal halide.

Hereinafter, a method for manufacturing a solar cell according to an exemplary embodiment of the present invention will be described below in more detail.

In the method for manufacturing a solar cell according to the exemplary embodiment of the present invention, the forming of the porous electrode (step a)) may be performed by forming the porous metal oxide layer on the first electrode.

In this case, the first electrode may be formed on a transparent substrate, which is a rigid substrate or flexible substrate, using physical vapor deposition, chemical vapor deposition, or thermal evaporation. As an example of the substrate, the rigid substrate may include a glass substrate, and the flexible substrate may contain polyethylene terephthalate (PET), polyethylene naphthalate (PEN), polyimide (PI), polycarbonate (PC), polypropylene (PP), triacetylcellulose (TAC), polyethersulfone (PES), or the like.

As the first electrode, any electrode may be used as long as it is a transparent conductive electrode ohmic contacting the porous metal oxide layer. As an example, the transparent conductive electrode may be made of one or more selected from fluorine doped tin oxide (FTO), indium doped tin oxide (ITO), ZnO, carbon nanotube (CNT), graphene, and a composite thereof.

The present invention includes all contents disclosed in PCT/KR2013/008270 and PCT/KR2013/008268 by the present applicant. In detail, as a detailed method for simultaneously manufacturing the composite layer and the light absorption structure body by applying the light absorber solution, the method provided in the PCT/KR2013/008270 and PCT/KR2013/008268 by the present applicant may be performed. In more detail, in order to simultaneously manufacture the composite layer and the light absorption structure body positioned on the composite layer by applying the light absorber solution, mainly, a concentration of the light absorber solution, the thickness of the porous electron carrier (specifically, the porous metal oxide), a porosity of the porous electron carrier (specifically, the porous metal oxide), and whether or not the light absorber solution remaining on the porous electron carrier after application is completed forms a film may be adjusted.

There is a limitation in that the concentration of the light absorber solution may not be increased more than a concentration of the saturated solution, and even though the film of the light absorber solution remains on the porous electron carrier, the light absorber solution may continuously permeate toward the porous electron carrier to thereby be consumed while the composite layer is formed. Therefore, in order to simultaneously manufacture the composite layer and the light absorption structure body positioned on the composite layer by applying the light absorber solution once, the thickness of the porous electron carrier (specifically, the porous metal oxide) may be mainly controlled.

In the case in which the thickness of the porous electron carrier is excessively thick, after applying the light absorber solution, the light absorber solution remaining on the composite layer may also be consumed in the composite layer, such that the light absorption structure body may not be manufactured. Even though the light absorption structure body is manufactured, a surface coverage of the composite layer by the light absorption structure body is decreased, such that efficiency improvement may be insufficient. In order to simultaneously manufacture the light absorption structure body while forming the light absorber in the composite layer by the solution application method in the single process, the thickness of the porous metal oxide layer (porous electron carrier) may be 1000 nm or less, preferably 800 nm or less, and more preferably 600 nm or less. Here, in view of increasing a contact area (interfacial area) between the metal oxide (electron carrier) and the light absorber in the composite layer, the lower limit of the thickness of the porous metal oxide layer may be 50 nm.

In the case in which the porosity of the porous metal oxide layer is excessively high, after applying the light absorber solution, the light absorber solution remaining on the composite layer may also be consumed in the composite layer, such that the light absorption structure body may not be manufactured. In order to simultaneously manufacture the light absorption structure body while forming the light absorber in the composite layer by applying the light absorber solution, the porosity of the porous electron carrier may be 30 to 65%, preferably, 40 to 60%.

In order to coat the surface (including the surface by the pores) of the porous metal oxide layer with the light absorber or fill the light absorber in the pores of the porous metal oxide layer and simultaneously form the light absorption structure body on the electron carrier impregnated with the light absorber using the solution application method, particularly, by applying and drying a single light absorber solution once instead of distributing the light absorber in the porous metal oxide layer as particles or a cluster (aggregates of the particles) independent of each other, it is preferable that a light absorber solution in which the light absorber is dissolved at a high concentration is used.

A concentration of the high concentration light absorber solution is not particularly limited, but in view of stably and reproducibly manufacturing the composite layer and the light absorption structure body, the concentration of the light absorber of the light absorber solution may satisfy the following Correlation Equation 2, preferably, the following Correlation Equation 2-1.

$$0.4\ M \leq Ms \leq Msat \quad \text{(Correlation Equation 2)}$$

$$0.8\ M \leq Ms \leq Msat \quad \text{(Correlation Equation 2-1)}$$

In Correlation Equations 2 and 2-1, Ms is a molar concentration of the light absorber in the light absorber solution, and Msat is a molar concentration of the light absorber in the light absorber solution in a saturated solution state at room temperature (25° C.). As a non-restrictive example, in considering a non-aqueous polar organic solvent having a vapor pressure of 0.01 mmHg to 10 mmHg at 20° C., Msat may be in a range of 1.1M to 1.8M.

In this case, the molar concentration of the light absorber in the light absorber solution may be increased more than Msat at 20° C. by adjusting a temperature of the light absorber solution to room temperature or more, and application of the light absorber solution may be performed by adjusting a temperature of the porous electrode so as to be equal or similar to a temperature of the light absorber solution heated to thereby maintain a predetermined temperature, or an ambient temperature of a sample at the time of application. This adjustment of the temperature of the light absorber solution, the temperature of the porous electrode at the time of applying the light absorber solution, and/or the ambient temperature at the time of application may be included in a modification example according to the spirit of the present invention. In addition, specific examples of the solvent of the light absorber solution are demonstrated based on 20° C., but at the time of applying the light absorber solution, the vapor pressure of the solvent may be adjusted by adjusting the temperature of the porous electrode and/or the ambient temperature, which may also be included in a modification example according to the spirit of the present invention.

At the time of applying the light absorber solution, a detailed method of applying the light absorber solution so that a liquid-phase film of the light absorber solution remains on the surface of the porous electron carrier may be changed according to the application method, but those working in applying a liquid to a substrate to form a material film may control the liquid-phase film to remain by changing process conditions in various application methods.

At the time of applying the light absorber solution, since the electron carrier has the porous structure, in view of uniform application of the solution, treatment of a large area, and a short processing time, the spin coating method may be preferably used. At the time of applying the light absorber solution using the spin coating method, an rpm of spin coating at which the light absorber solution may be uniformly applied and the liquid-phase film of the light absorber solution may remain on the porous electron carrier may be suitable. When rotational force is excessively small at the time of spin coating, it may be difficult to uniformly apply the light absorber solution onto a large-area porous electron carrier, and when the rotational force is excessively large, the liquid-phase (film) of the light absorber solution may not remain on the porous electron carrier impregnated with the light absorber solution. Those skilled in the art may deduce various spin coating conditions for allowing the liquid-phase film of the light absorber solution to remain on the surface of the electron carrier while uniformly applying the light absorber solution through repetitive experiments. As a non-restrictive and specific example, the maximum rpm at the time of spin coating is preferably less than 5000 rpm. More stably, the spin coating may be performed preferably at 4000 rpm or less, more preferably, at 3000 rpm or less. In this case, the spin coating may be performed by a multi-step process so as to gradually increase the rpm while satisfying the maximum rpm of 5000 rpm, preferably, 4000 rpm or less, and more preferably 3000 rpm or less. As long as the maximum rpm is 5000 rpm, preferably, 4000 rpm or less, and more preferably 3000 rpm or less, various specific methods that are known as an effective method for uniformly and homogeneously applying a liquid at the time of applying a general liquid using the spin coating method may be used. In this case, in view of uniformly applying the light absorber solution onto the large-area porous electron carrier in a short time, the minimum rpm at the time of spin coating, may be 100 rpm, preferably 500 rpm, and more preferably 1000 rpm.

An amount of light absorber solution applied at the time of spin coating may be suitably adjusted in consideration of a total pore volume (Vs) of the porous electron carrier. It is preferable that an amount more than the total pore volume is applied so that the light absorber solution may be uniformly applied even on a large area to uniformly and homogeneously form the composite layer and the light absorption structure body. As a non-restrictive example, the light absorber solution may be applied 10 to 1000 times the total pore volume (Vs). However, in the case of applying the light absorber solution using the spin coating method, since the light absorber solution more than a predetermined amount may be removed by rotational force, it is preferable that the solution is applied at an amount more than the total pore volume so that the light absorber solution may be easily, uniformly, and homogeneously injected into the pores of the large-area porous electrode. In this case, the light absorber solution applied onto the porous electron carrier may be continuously or discontinuously put (injected) into the porous metal oxide during the spin coating or be put (injected) thereinto at one time at an initiation point in time of the spin coating.

At the time of manufacturing the composite layer and the light absorption structure body by the solution application method of applying the light absorber solution to form the light absorber (including the light absorber of the composite layer and the light absorber of the light absorption structure body), a size (including a thickness in the case of a thin film) of the light absorption structure body formed on the composite layer may be adjusted by adjusting the amount of light absorber solution forming the film and remaining on the porous electron carrier, the concentration of the light absorber solution, and/or the thickness of the porous electron carrier.

Here, in the case in which the size of the light absorption structure body is adjusted through the thickness of the porous electron transport body, when the contact area between the electron carrier and the light absorber is excessively small, Power conversion efficiency may be decreased, and the amount of the remaining light absorber solution may have a process variation according to the application method and condition. Therefore, in view of stable, reproducible, and precise adjustment, it is preferable to adjust the size of the light absorption structure body by adjusting the concentration of the light absorber solution. As a non-restrictive example, a light absorption structure body (including a light absorber thin film) having a thickness of 10 nm to 1000 nm may be manufactured by increasing the concentration of the light absorber solution under the condition at which the concentration of the light absorber solution satisfies the Correlation Equation 2, preferably Correlation Equation 2-1 in a state in which the thickness of the porous electron carrier and application conditions are fixed.

The porous electrode in step a) may be manufactured by applying, drying, and heat-treating slurry containing metal oxide particles on the first electrode.

In detail, in step a), the slurry containing the metal oxide particles is applied on the first electrode and the applied slurry layer is dried and heat-treated, thereby manufacturing the porous electrode. Application of the slurry may be performed by one or more methods selected from a screen printing method; a spin coating method; a bar coating method; a gravure coating method; a blade coating method; and a roll coating method.

Main factors affecting a specific surface area and an open pore structure of the porous metal oxide layer are an average particle size of the metal oxide particles and a heat-treatment temperature. The average particle size of the metal oxide particles may be 5 to 500 nm, and heat-treatment may be performed at 200 to 600° C. under air atmosphere.

A coating thickness of the slurry may be adjusted so that a thickness of the porous metal oxide layer manufactured by drying the slurry applied in the forming of the porous metal oxide layer and then heat-treating the dried slurry becomes preferably 50 nm to 10 μm, more preferably 50 nm to 5 μm, more preferably 50 nm to 1 μm, more preferably 50 to 800 nm, more preferably 50 to 600 nm, further more preferably 100 to 600 nm, and most preferably 200 to 600 nm.

In the method for manufacturing a solar cell according to an exemplary embodiment of the present invention, after step a) and before step b), a post-processing step of impregnating the porous electrode into a metal precursor-dissolved solution containing a metal element of the metal oxide particles may be further performed.

The metal precursor in the post-processing step may be a metal halide including a metal chloride, a metal fluoride, and a metal iodide, and a metal of the metal precursor may be one or two or more selected from Ti, Zn, In, Sn, W, Nb, Mo, Mg, Zr, Sr, Yr, La, V, Al, Y, Sc, Sm, Ga, and In, and be the same as or different from the metal of the metal oxide particles.

The metal precursor-dissolved solution may be a solution in which the metal precursor is dissolved at a low concentration of 10 to 200 mM, and the post-processing process may be performed by separating and recovering the porous electrode after the impregnation is performed for 6 to 18 hours.

In the post-processing, when the porous electrode manufactured by applying the slurry containing the metal oxide particles on the first electrode and then heat-treating the applied slurry is left in a significantly weak metal precursor-dissolved solution, a significantly small metal oxide particle is generated by hydrolysis even at room temperature with the passage of time to thereby be attached to the metal oxide particle of the porous metal oxide layer.

Significantly fine metal oxide particles (post-processing particles) generated by this post-processing are present between particles of the porous metal oxide layer having relatively many defects, such that the efficiency of a device may be increased by improving a flow of the electrons of the electrode having a porous structure and preventing electron annihilation, and an amount of the attached light absorber may also be increased by increasing the specific surface.

In this case, before performing the forming of the porous metal oxide layer, forming a thin film of the metal oxide on the first electrode (a thin film forming step) may be further performed. The thin film forming step may be performed by a chemical or physical deposition method used in a general semiconductor process and performed by a spray pyrolysis method (SPM).

A material of a metal oxide thin film may be one or more materials selected from Ti oxide, Zn oxide, In oxide, Sn oxide, W oxide, Nb oxide, Mo oxide, Mg oxide, Zr oxide, Sr oxide, Yr oxide, La oxide, V oxide, Al oxide, Y oxide, Sc oxide, Sm oxide, Ga oxide, In oxide, Sr—Ti oxide, and a composite thereof and be the same or different from the metal oxide particles of the porous metal oxide layer.

After forming the porous metal oxide layer on the first electrode to manufacture the composite layer or the porous electrode in step a), the forming of the light absorber may be performed.

The forming of the light absorber (step b)) may be performed by a significantly simple and rapid process of applying and drying the light absorber solution in which the organic halide and the metal halide are dissolved on the porous electrode as the solution for forming the light absorber containing the organic-metal halide having the perovskite structure.

In this case, the porosity of the composite layer or the size and/or the shape of the light absorption structure body (pillar) extended from the composite layer may be controlled by using the light absorber solution containing the organic halide and the metal halide so as to have the non-stoichiometric ratio based on the desired organic-metal halide as the light absorber.

In detail, the size, the shape and/or the porosity of the light absorption structure body may be controlled by the molar ratio of the organic halide and the metal halide contained in the light absorber solution.

In detail, the organic-metal halide having the perovskite structure as the basis of the stoichiometric ratio may satisfy the following Chemical Formula 1.

$$AMX_3 \quad \text{(Chemical Formula 1)}$$

(In Chemical Formula 1, A is a monovalent organic ammonium ion, a monovalent ammonium ion, or $Cs^+$, M is a divalent metal ion, and X is a halogen ion.)

In more detail, when A is the monovalent organic ammonium ion, the organic-metal halide having the perovskite structure as the basis of the stoichiometric ratio may satisfy the following Chemical Formula 1-1.

$$(R_1\text{—}NH_3^+)MX_3 \quad \text{(Chemical Formula 1-1)}$$

In Chemical Formula 1-1, $R_1$ is (C1-C24)alkyl, (C3-C20)cycloalkyl, or (C6-C20)aryl, M is one or two or more metal ions selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X is one or two or more halogen ions selected from $I^-$, $Br^-$, and $Cl^-$. In more detail, in Chemical Formula 1-1, $R_1$ may be (C1-C24)alkyl, more specifically, (C1-C7)alkyl.

In more detail, when A is the monovalent organic ammonium ion, the organic-metal halide having the perovskite structure as the basis of the stoichiometric ratio may satisfy the following Chemical Formula 1-2.

$$(R_2C_3H_3N_2^+\text{—}R_3)MX_3 \quad \text{(Chemical Formula 1-2)}$$

In Chemical Formula 1-2, $R_2$ is (C1-C24)alkyl, (C3-C20)cycloalkyl, or (C6-C20)aryl, $R_3$ is hydrogen or (C1-C24)alkyl, M is one or two or more metal ions selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X is one or two or more halogen ions selected from $I^-$, $Br^-$, and $Cl^-$. In more detail, in Chemical Formula 1-2, $R_1$ may be (C1-C24)alkyl, more specifically, (C1-C7)alkyl.

More specifically, when A is the monovalent ammonium ion, the organic-metal halide having the perovskite structure as the basis of the stoichiometric ratio may be $NH_4MX_3$, and M and X are as defined in Chemical Formula 1-1 or 1-2.

In detail, the organic halide contained in the precursor solution may satisfy the following Chemical Formula 2.

$$AX \quad \text{(Chemical Formula 2)}$$

In Chemical Formula 2, A is a monovalent organic ammonium ion or $Cs^+$, and X is a halogen ion.

In more detail, the organic halide contained in the precursor solution may satisfy the following Chemical Formula 2-1.

$$(R_1\text{—}NH_3^+)X \quad \text{(Chemical Formula 2-1)}$$

In Chemical Formula 2-1, $R_1$ is (C1-C24)alkyl, (C3-C20)cycloalkyl, or (C6-C20)aryl, and X is one or two or more halogen ions selected from $I^-$, $Br^-$, and $Cl^-$. In more detail, in Chemical Formula 2-1, $R_1$ may be (C1-C24)alkyl, more specifically, (C1-C7)alkyl. In more detail, X may be $I^-$, $Br^-$, and $Cl^-$.

In more detail, the organic halide contained in the precursor solution may satisfy the following Chemical Formula 2-2.

$$(R_2\text{—}C_3H_3N_2^+\text{—}R_3)X \quad \text{(Chemical Formula 2-2)}$$

In Chemical Formula 2-2, $R_2$ is (C1-C24)alkyl, (C3-C20)cycloalkyl, or (C6-C20)aryl, $R_3$ is hydrogen or (C1-C24)alkyl, and X is one or two or more halogen ions selected from $I^-$, $Br^-$, and $Cl^-$. In more detail, in Chemical Formula 2-2, $R_1$ may be (C1-C24)alkyl, more specifically, (C1-C7)alkyl. In more detail, X may be $I^-$, $Br^-$, and $Cl^-$.

In more detail, the organic halide contained in the precursor solution may be $NH_4X$, wherein X may be $I^-$, $Br^-$, and $Cl^-$.

In detail, the metal halide contained in the precursor solution may satisfy the following Chemical Formula 3.

$$MX_2 \quad \text{(Chemical Formula 3)}$$

In Chemical Formula 3, M is one or two or more metal ions selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X is one or two or more halogen ions selected from $I^-$, $Br^-$, and $Cl^-$. In more detail, X may be $I^-$, $Br^-$, and $Cl^-$.

As described above, as the light absorber containing the organic-metal halide of Chemical Formula 1 is formed from the light absorber solution in which the organic halide of Chemical Formula 2 and the metal halide of Chemical Formula 3 are dissolved, A of Chemical Formula 1 may be the same as A of Chemical Formula 2, and M of Chemical Formula 1 may be the same as M of Chemical Formula 3. In addition, X of Chemical Formula 2 and X of Chemical Formula 3 may be the same or different halogen ions, and X of Chemical Formula 1 may be X of Chemical Formula 2 or X of Chemical Formula 3.

The light absorber solution may be a solution in which the organic halide satisfying Chemical Formula 2 and the metal halide satisfying Chemical Formula 3 are dissolved, and contain the organic halide satisfying Chemical Formula 2 and the metal halide satisfying Chemical Formula 3 at a molar ratio that does not satisfy the stoichiometric ratio based on the organic-metal halide of Chemical Formula 1.

More specifically, based on the stoichiometric ratio, in the case in which the light absorber solution contains a smaller amount of the organic halide, a larger and angular shaped pillar may be manufactured, and in the case in which the light absorber solution contains a larger amount of the organic halide, a significantly fine or round shaped pillar may be manufactured.

In detail, based on the organic-metal halide, the molar ratio of the organic halide and the metal halide contained in the light absorber solution at the non-stoichiometric ratio may satisfy the following Correlation Equation 1.

$$1 < M_o/M_m \le 1.5 \quad \text{(Correlation Equation 1)}$$

In Correlation Equation 1, $M_o$ is a mole number of the organic halide contained in the light absorber solution, and $M_m$ is a mole number of the metal halide contained in the light absorber solution.

The molar ratio of Correlation Equation 1 is a molar ratio at which a pillar having a fine size of 10 μm or less is formed, the solar cell may have excellent optical properties, that is, a short-circuit current density of 15 mA/cm² or more, an open circuit voltage of 0.95V or more, and a fill factor of 0.7 or more, and the solar cell may have Power conversion efficiency of 10% or more.

In detail, based on the organic-metal halide, the molar ratio of the organic halide and the metal halide contained in the light absorber solution at the non-stoichiometric ratio may satisfy the following Correlation Equation 2.

$$1 < M_o/M_m < 1.25 \quad \text{(Correlation Equation 2)}$$

In Correlation Equation 2, $M_o$ is a mole number of the organic halide contained in the light absorber solution, and $M_m$ is a mole number of the metal halide contained in the light absorber solution.

In the case in which the light absorber solution contains the organic halide and the metal halide at a molar ratio satisfying the above-mentioned Correlation Equation 2, the molar ratio is a molar ratio at which a significantly fine and plate shape pillar having a size (diameter) of 10 μm or less may be uniformly formed, an area of the pillar covering the surface of the composite layer may be increased, the solar cell may have excellent optical properties, that is, a short-circuit current density of 17 mA/cm$^2$ or more, an open circuit voltage of 0.98V or more, and a fill factor of 0.75 or more, and the solar cell may have Power conversion efficiency of 12% or more.

As a solvent of the light absorber solution, any solvent may be used as long as it may dissolve both of the organic halide and the metal halide and be easily volatilized and removed at the time of drying. In detail, the solvent of the light absorber solution includes all of the solvents disclosed in PCT/KR2013/008270 and PCT/KR2013/008268 by the present applicant. As a specific example, the solvent of the light absorber solution may be a non-aqueous polar organic solvent, more specifically, a non-aqueous polar organic solvent having vapor pressure of 0.01 mmHg to 10 mmHg at 20° C. As a non-restrictive example, the solvent of the light absorber solution may be one or two or more selected from gamma-butyrolactone, formamide, N,N-dimethylformamide, diformamide, acetonitrile, tetrahydrofuran, dimethylsulfoxide, diethyleneglycol, 1-methyl-2-pyrrolidone, N,N-dimethylacetamide, acetone, α-terpineol, β-terpineol, dihydroterpineol, 2-methoxyethanol, acetylacetone, methanol, ethanol, propanol, butanol, pentanol, hexanol, ketone, methylisobutyl ketone, and the like. As another specific example, the solvent of the light absorber solution may be a mixed solvent (first mixed solvent) in which at least two non-aqueous polar organic solvents having different vapor pressures from each other are mixed. Here, in the mixed solvent, a vapor pressure of the first solvent having a relatively high vapor pressure may be 2 to 20 times a vapor pressure of the second solvent having a relatively low vapor pressure, and the vapor pressure of the second solvent may be 0.01 to 4 mmHg, preferably 0.1 to 4 mmHg at 20° C.

As an application method of the light absorber solution, a general solution application method used in a semiconductor process may be used, but since the porous electrode has a porous structure, in view of uniform application of the solution and easiness of treatment of a large area, a spin coating method may be preferably used.

When a process of applying and drying the light absorber solution is considered as a unit process, the composite layer and the light absorption structure body may be formed by repeating the unit process. Alternatively, the light absorption structure body may be formed on the porous electrode provided with the light absorber by a single unit process. In this case, the composite layer and the light absorption structure body may be formed through a single applying and drying process by increasing the concentration of the light absorber solution.

The concentration of the high concentration light absorber solution is not particularly limited, but in view of stably and reproducibly manufacturing the composite layer and the light absorption structure body, the concentration of the light absorber of the light absorber solution may satisfy the above-mentioned Correlation Equation 2, preferably, Correlation Equation 2-1.

An amount of light absorber solution applied at the time of spin coating may be suitably adjusted in consideration of a total pore volume (Vs) of the porous metal oxide layer. It is preferable that an amount more than the total pore volume is applied so that the light absorber solution may be uniformly applied even on a large area to uniformly and homogeneously form the composite layer and the light absorption structure body. As a non-restrictive example, the light absorber solution may be applied 10 to 1000 times the total pore volume (Vs). However, in the case of applying the light absorber solution using the spin coating method, since the light absorber solution more than a predetermined amount may be removed by rotational force, it is preferable that the solution is applied at an amount more than the total pore volume so that the light absorber solution may be easily, uniformly, and homogeneously injected into the pores of the large-area porous electrode. In this case, the light absorber solution applied onto the porous metal oxide may be continuously or discontinuously put (injected) into the porous metal oxide during the spin coating or be put (injected) thereinto once at an initiation point in time of the spin coating.

As described above, in view of uniformly applying the solution in the porous structure having a large area in a short time, application may be performed by spin coating. In the case of applying the light absorber solution using the spin coating method, it is preferable that the maximum rpm of a rotational speed at the time of spin coating is not over 5000 rpm so that the film of the light absorber solution may remain on the porous metal oxide layer. In addition, it is preferable that the spin coating is more stably performed at 4000 rpm or less, and more stably, 3000 rpm or less. In this case, when the light absorber solution is applied at the different rotational speeds two times or more under the condition at which the maximum rpm is not over 5000 rpm, the light absorption structure body may be more excellently adjusted. The drying (or annealing) of the applied light absorber solution is not particularly limited, but may be performed, for example, at a temperature of 60 to 150° C. and a normal pressure for 3 to 100 minutes.

At the time of applying the light absorber solution, a method of using a non-solvent disclosed in PCT/KR2013/008270 and PCT/KR2013/008268 by the present applicant may also be used. In detail, a method for contacting the applied light absorber solution with the non-solvent in a state in which the light absorber solution is applied on the porous metal oxide layer and the solvent of the applied light absorber solution is not entirely volatilized and removed but remains may be used. Specifically, after application of the light absorber solution using the spin coating method is completed, the non-solvent may be sequentially applied, or after the light absorber solution is injected into a region of the porous electron carrier corresponding to the rotational center, while the porous electron carrier is rotated so as to uniformly disperse the injected light absorber solution, the non-solvent may be re-injected into the region of the porous electron carrier corresponding to the rotational center. The non-solvent of the light absorber may mean an organic solvent in which the light absorber is not dissolved, specifically, an organic solvent in which solubility of the light absorber at 20° C. and 1 atm is less than 0.1M, specifically, less than 0.01M, and more specifically, less than 0.001M. More specifically, the non-solvent of the light absorber may be a non-polar organic solvent, preferably, a non-polar solvent having permittivity (e; relative permittivity) of 20 or less, substantially permittivity of 1 to 20. A specific example of the non-solvent of the light absorber may be one or two or more selected from pentane, hexene, cyclohexene, 1,4-dioxane, benzene, toluene, triethylamine, chlorobenzene, ethylamine, ethylether, chloroform, ethylacetate, acetic acid, 1,2-dichlorobenzene, tert-butylalcohol, 2-butanol, isopropanol, and methylethylketone, but is not limited thereto. In the case of using the non-solvent, the drying (or annealing) may be performed after application of the light absorber solution and application of the non-solvent are performed, and this drying (annealing) may be performed at a temperature of 60 to 150° C. and a normal pressure for 3 to 100 minutes.

After the forming of the light absorption structure body is performed, the forming of the hole conduction layer may be performed.

The forming of the hole conduction layer may be performed by applying and drying the solution containing an organic hole transport material (hereinafter, an organic hole transport solution) so as to cover an upper portion of the composite layer or the composite layer provided with the light absorption structure body. The application may be performed by spin coating. The organic hole transport material (organic hole transport layer) may have a thickness of 10 nm to 500 nm.

As a solvent used for forming the hole conduction layer, any solvent may be used as long as it may dissolve the organic hole transport material and does not chemically react with the materials of the light absorber and the porous electrode. As an example, the solvent used for forming the hole conduction layer may be a non-polar solvent. As a substantial example, the solvent may be one or two or more solvents selected from toluene, chloroform, chlorobenzene, dichlorobenzene, anisole, xylene, and hydrocarbon based solvents having 6 to 14 carbon atoms.

The organic hole transport material used in the forming of the hole conduction layer may be one or two or more selected from thiophene based materials, paraphenylenevinylene based materials, carbazole based material, and triphenylamine based materials.

In the case in which the light absorber is the organic-metal halide having the perovskite structure, the organic hole transport material may be preferably one or two or more selected from the thiophene based materials and the triphenylamine based materials, more preferably, the triphenylamine based materials. Therefore, the solar cell may have photoelectric conversion efficiency further improved by energy matching with the light absorber having the perovskite structure.

In detail, the organic hole transport material may satisfy the following Chemical Formula 4.

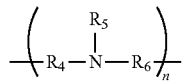

(Chemical Formula 4)

($R_4$ and $R_6$ are each independently (C6-C20)arylene, $R_5$ is (C6-C20)aryl, arylene of $R_4$ or $R_6$ or aryl of $R_5$ may be each independently substituted with one or more selected from a group consisting of halogen, (C1-C30)alkyl substituted or unsubstituted with halogen, (C6-C30)aryl, (C2-C30)heteroaryl substituted or unsubstituted with (C6-C30)aryl, 5- to 7-membered heterocycloalkyl, 5- to 7-membered heterocycloalkyl fused with one or more aromatic rings, (C3-C30) cycloalkyl, (C6-C30)cycloalkyl fused with one or more aromatic rings, (C2-C30)alkenyl, (C2-C30)alkinyl, cyano, carbazolyl, (C6-C30)ar(C1-C30)alkyl, (C1-C30)alkyl(C6-C30)aryl, nitro, and hydroxyl, and n is a natural number of 2 to 100,000.)

In Chemical Formula 4, $R_4$ and $R_6$ are each independently phenylene, naphthylene, biphenylene, terphenylene, anthrylene indenylene, fluorenylene, phenanthrylene, triphenylenylene, pyrenylene, perylenylene, chrysenylene, naphthacenylene, or fluoranthenylene, and $R_5$ may be phenyl, naphthyl, biphenyl, terphenyl, anthryl, indenyl, fluorenyl, phenanthryl, triphenylenyl, pyrenyl, perylenyl, chrysenyl, naphthacenyl, or fluoranthenyl.

In detail, the organic hole transport material may be one or two or more selected from poly[3-hexylthiophene] (P3HT), poly[2-methoxy-5-(3',7'-dimethyloctyloxyl)]-1,4-phenylene vinylene (MDMO-PPV), poly[2-methoxy-5-(2"-ethylhexyloxy)-p-phenylene vinylene] (MEH-PPV), poly(3-octyl thiophene) (P3OT), poly(octyl thiophene) (POT), poly(3-decyl thiophene) (P3DT), poly(3-dodecyl thiophene (P3DDT), poly(p-phenylene vinylene) (PPV), poly(9,9'-dioctylfluorene-co-N-(4-butylphenyl)diphenyl amine (TFB), polyaniline, [2,2',7,7'-tetrkis (N,N-di-p-methoxyphenyl amino)-9, 9'-spirobifluorene] (Spiro-NeOTAD), CuSCN, CuI, poly[2,1, 3-benzothiadiazole-4,7-diyl[4,4-bis(2-ethylhexyl-4H-cyclopenta[2,1-b:3,4-b']dithiophene-2,6-diyl]] (PCPDTBT), poly[(4,4'-bis(2-ethylhexyl)dithieno[3,2-b:2',3'-d]silole)-2, 6-diyl-alt-(2,1,3-benzothiadiazole)-4,7-diyl] (Si-PCP-DTBT), poly((4,8-diethylhexyloxyl)benzo([1,2-b:4,5-b'] dithiophene)-2,6-diyl)-alt-((5-octylthieno[3,4-c]pyrrole-4, 6-dione)-1,3-diyl) (PBDTTPD), poly[2,7-(9-(2-ethylhexyl)-9-hexyl-fluorene)-alt-5,5-(4',7,-di-2-thienyl-2',1',3'-benzothiadiazole)] (PCDTBT), poly[2,7-9,9-(dioctyl-fluorene)-alt-5,5-(4',7'-di-2-thienyl-2',1',3'-benzothiadiazole)] (PFO-DBT), poly[(2,7-dioctylsilafluorene)-2,7-diyl-alt-(4,7-bis(2-thienyl)-2,1,3-benzothiadiazole)-5,5'-diyl] (PSiFDTBT), poly[(4,4'-bis(2-ethylhexyl)dithieno[3,2-b:2',3'-d]silole)-2,6-diyl-alt-(2,1,3-benzothiadiazole)-4,7-diyl] (PSBTBT), poly[[9-(1-octylnonyl)-9H-carbazole-2,7-diyl]-2,5-thiophenediyl-2,1, 3-benzothiadiazole-4,7-diyl-2,5-thiophenediyl] (PCDTBT), poly(9,9'-dioctylfluorene-co-bis(N,N'-(4,butylphenyl))bis (N,N'-phenyl-1,4-phenylene)diamine (PFB), poly(9,9'-dioctylfluorene-co-benzothiadiazole (F8BT), poly(3,4-ethylenedioxythiophene) (PEDOT), poly(3,4-ethylenedioxythiophene) poly(styrenesulfonate (PEDOT: PSS), poly(triarylamine) (PTAA), poly(4-butylphenyl-diphenyl-amine, and a copolymer thereof. The compound names may be represented by only abbreviations generally used in the art.

In the forming of the hole conduction layer, an organic hole solution may further contain one or two or more additives selected from tertiary butyl pyridine (TBP), lithium bis(trifluoro methanesulfonyl)imide (LiTFSI), and tris(2-(1H-pyrazol-1-yl)pyridine)cobalt(III). The organic hole solution contains the additive, such that the fill factor, the short-circuit current, or the open circuit voltage may be increased. In this case, the additive may be contained at an amount of 0.05 to 100 mg per 1 g of the organic hole transport material contained in the organic hole solution.

After the forming of the hole conduction layer is performed, the forming of the second electrode may be performed. The forming of the second electrode may be performed by a general metal deposition method used in the semiconductor process. As an example, the second electrode may be formed using physical vapor deposition or chemical vapor deposition, and may be formed using thermal evaporation. As the second electrode, any electrode material generally used in a solar cell field as a counter electrode of a porous electrode may be used. As a substantial example, the second electrode may be made of one or more materials selected from gold, silver, platinum, palladium, copper, aluminum, carbon, cobalt sulfide, copper sulfide, nickel oxide, and composites thereof.

Hereinafter, Manufacturing Examples of the solar cell will be described in detail, but the Examples are provided only for assisting in the entire understanding of the present invention by way of example, and the present invention is not limited thereto.

EXAMPLE 1

Methylammonium iodide ($CH_3NH_3I$) and lead diiodide ($PbI_2$) were dissolved at a molar ratio of 1.1:1 in gamma-butyrolactone and stirred at 60° C. for 12 hours, thereby preparing 40 wt % of methylammonium leadtriiodide ($CH_3NH_3PbI_3$) solution (hereinafter, a light absorber solution).

After a glass substrate on which fluorine doped tin oxide (FTO; F-doped $SnO_2$, 8 ohms/$cm^2$, Pilkington, hereinafter, FTO substrate (first electrode)) was coated was cut at a size of 25×25 mm, end portions thereof were etched to partially remove FTO.

A dense structured $TiO_2$ thin film having a thickness of about 50 nm was manufactured by a spray pyrolysis method (SPM) on the cut and partially etched FTO substrate. The SPM was performed using a titanium acetylacetonate (TAA): EtOH (1:9 v/v %) solution, and the thickness was adjusted by repeating a process of spraying the solution onto the FTO substrate positioned on a hot plate maintained at 450° C. for 3 seconds and stopping for 10 seconds.

5 ml of an ethyl cellulose solution in which 10 wt % of ethyl cellulose was dissolved in ethyl alcohol was added to $TiO_2$ powder having an average particle size of 50 nm (preparing by hydrothermal treatment of an aqueous solution in which titanium peroxo complex (1 wt % based on $TiO_2$) was dissolved at 250° C. for 12 hours) per 1 g of $TiO_2$, and 5 g of terpinol was added thereto per 1 g of $TiO_2$ and then mixed, followed by removing ethyl alcohol by a vacuum distillation method, thereby preparing a $TiO_2$ powder paste.

The prepared $TiO_2$ powder paste was coated onto the $TiO_2$ thin film on the FTO substrate by a screen printing method and heat-treated at 500° C. for 60 minutes. Then, after the heat-treated substrate is immersed in 30 mM $TiCl_4$ aqueous solution at 60° C. and left for about 30 minutes, the substrate was washed and dried using deionized water and ethanol, followed by heat-treatment at 500° C. for 30 minutes, thereby manufacturing a porous metal oxide layer having a specific surface area of 40 $m^2$/g and a thickness of 600 nm.

The prepared light absorber solution was spin coated on the manufactured porous metal oxide layer at 2000 rpm for 60 seconds and 3000 rpm for 60 seconds and dried on a hot plate (100° C.) for 60 minutes, thereby forming a light absorber having a perovskite structure.

A poly(triarylamine) (PTAA, EM index, Mw=17,500 g/mol) dissolved dichlorobenzene solution (15 mg (PTAA)/1 mL (dichlorobenzene)) was spin coated on the substrate on which the light absorber was coated at 2500 rpm for 60 seconds, thereby forming a hole conduction layer.

Thereafter, Au was vacuum deposited on an upper portion of a hole conduction layer using high vacuum ($5\times10^{-6}$ torr or less) thermal evaporator, thereby forming an Au electrode (second electrode) at a thickness of about 70 nm.

In order to measure current-voltage characteristics of the manufactured solar cell, an ORIEL class A solar simulator (Newport, model 91195A) and a source-meter (Kethley, model 2420) were used.

EXAMPLE 2

A solar cell was manufactured by the same manner in Example 1 except for using a methylammonium leadtriiodide ($CH_3NH_3PbI_3$) solution prepared by changing a molar ratio of methylammonium iodide ($CH_3NH_3I$) and lead diiodide ($PbI_2$) to 1.25:1 as a light absorption solution.

EXAMPLE 3

A solar cell was manufactured by the same manner in Example 1 except for using a methylammonium leadtriiodide ($CH_3NH_3PbI_3$) solution prepared by changing a molar ratio of methylammonium iodide ($CH_3NH_3I$) and lead diiodide ($PbI_2$) to 0.9:1 as a light absorption solution.

EXAMPLE 4

A solar cell was manufactured by the same manner in Example 1 except for using a methylammonium leadtriiodide ($CH_3NH_3PbI_3$) solution prepared by changing a molar ratio of methylammonium iodide ($CH_3NH_3I$) and lead diiodide ($PbI_2$) to 1.5:1 as a light absorption solution.

Comparative Example 1

A solar cell was manufactured by the same manner in Example 1 except for using a methylammonium leadtriiodide ($CH_3NH_3PbI_3$) solution prepared by changing a molar ratio of methylammonium iodide ($CH_3NH_3I$) and lead diiodide ($PbI_2$) to 1:1 as a light absorption solution as a light absorption solution.

FIG. 1 illustrates optical microscope photographs obtained by forming the light absorber on the porous metal oxide layer in Examples 1 to 4 and Comparative Example 1 and then observing a surface thereof. As illustrated in FIG. 1, it was confirmed that light absorber pillars were formed on a surface of the porous metal oxide layer, and it may be appreciated that a size, a shape, and a density of the formed pillar were changed according to the molar ratio of methylammonium iodide ($CH_3NH_3I$) and lead diiodide ($PbI_2$) of a precursor solution.

It may be appreciated that in Example 3 in which the molar ratio $M_o/M_m$ of methylammonium iodide ($CH_3NH_3I$) and lead diiodide ($PbI_2$) was less than 1, coarser and more angular pillars having a size of 20 μm to 40 μm were formed, and it may be appreciated that in Examples 1, 2, and 4 in which the molar ratio $M_o/M_m$ of methylammonium iodide ($CH_3NH_3I$) and lead diiodide ($PbI_2$) was more than 1, finer pillars were formed as compared to Comparative Example 1.

Further, it may be appreciated that in the case in which the molar ratio $M_o/M_m$ satisfied $1<M_o/M_m<1.25$ as in Example 1, that is, in the case in which the light absorber solution contained an excessive amount of an organic halide and the excessive amount was relatively small, significantly fine plate shaped pillars having a size of 10 μm or less were formed at a high density. It may be appreciated that when the light absorber solution contained an excessive amount of the organic halide and the excessive amount was relatively large as in Example 2, fine and round shaped pillars were formed at a high density, and when the excessive amount was relatively significantly large as in Example 4, a density was decreased and round shaped coarse pillars were formed. Referring to a result of Comparative Example 1 satisfying the stoichiometric ratio, it may be appreciated that as an amount of the metal halide excessively contained in the light absorber solution was further increased as compared to the organic halide, larger angular plate shaped pillars were formed, and in the case in which the light absorber solution contained an excessive amount of the organic halide as compared to the metal halide, as the ratio was further deviated from the stoichiometric ratio, significantly fine plate shaped pillars and coarse round shaped pillars were sequentially formed.

As described above, the size and shape of the pillar may affect optical properties of the solar cell. The reason is that the size and shape of the pillar may affect interfacial resistance between the porous metal oxide layer (composite layer) provided with the light absorber and the pillars, separation and movement efficiency of photo-holes, an effect of limiting movement of photo-holes in a direction toward the second electrodes by the pillar, and the contact area with the hole conduction layer, and the like.

The following Table 1 shows results obtained by measuring performance of the solar cells manufactured in Examples 1 to 4 and Comparative Example 1.

TABLE 1

Performance of Solar Cell

| | Short-circuit current density (mA/cm²) | Open circuit voltage (V) | Fill factor | Power conversion efficiency (%) |
|---|---|---|---|---|
| Example 1 | 17.5 | 0.98 | 0.75 | 12.8 |
| Example 2 | 15.2 | 0.97 | 0.72 | 10.6 |
| Example 3 | 10.2 | 0.92 | 0.58 | 5.4 |
| Example 4 | 3.5 | 0.60 | 0.48 | 1.0 |
| Comparative Example 1 | 17.5 | 0.88 | 0.65 | 10.0 |

As illustrated in Table 1, it may be appreciated that in the case in which the pillars having a size of 10 μm or less were formed on the composite layer as in Examples 1 and 2, the solar cell had an excellent open circuit voltage and fill factor, such that the solar cell had an excellent Power conversion efficiency and fill factor, and particularly, in the case in which the pillars having a fine structure were formed as in Example 1, charges generated in the light absorber were more easily separated and moved, such that the solar cell had a high fill factor and power conversion efficiency. On the contrary, in the case in which the size of the pillar was relatively large as in Example 3 and Comparative Example 1, the solar cell had a low short-circuit current density and open circuit voltage, such that the solar cell had low efficiency. The reason is that in a structure in which the size of the pillar formed on the composite layer was limited to being small, an interface between the organic hole transport material and the pillar was increased, such that photo-holes were more efficiently transported, thereby having excellent power conversion efficiency. It may be appreciated that in Example 4, as the excessive amount of the organic halide corresponding to 0.5 times an amount according to the stoichiometric ratio was injected, unreacted organic halide remained on the light absorber together with the organic-metal halide having the perovskite structure, such that Power conversion efficiency was decreased. As a result of observing compositions of the light absorption bodies of the manufactured solar cells using X-ray spectrometry, it was confirmed that in Examples 1 to 3 and Comparative Example 1, a ratio of Pb and I of the light absorber was 1:3, but in Example 4, a ratio of Pb and I of the finally formed light absorber was 1:4, such that it was confirmed that the organic halide remained.

Hereinabove, although the present invention is described by specific matters, exemplary embodiments, and drawings, they are provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the above-described embodiments, and the following claims as well as all modified equally or equivalently to the claims are intended to fall within the scope and spirit of the invention.

The invention claimed is:

1. A method for manufacturing a solar cell, the method comprising:
   a) forming an electron transport layer on a first electrode;
   b) forming a light absorber by applying a light absorber solution as a solution for forming the light absorber containing an organic-metal halide having a perovskite structure, the light absorber solution containing an organic halide and a metal halide dissolved therein so as to have a non-stoichiometric ratio based on the organic-metal halide;
   c) forming a hole conduction layer by applying and drying a hole transport solution in which an organic hole transport material is dissolved; and
   d) forming a second electrode, which is a counter electrode of the first electrode, on the hole conduction layer.

2. The method of claim 1, wherein step a) includes forming a porous metal oxide layer on the first electrode, and
   step b) includes applying and drying the light absorber solution on the porous metal oxide layer to form a composite layer in which the light absorber is impregnated into the porous metal oxide layer and a light absorption structure body extended from the composite layer and made of the light absorber,
   a shape of the light absorption structure body being controlled by a molar ratio of the organic halide and the metal halide contained in the light absorber solution.

3. The method of claim 1, wherein the organic halide satisfies Chemical Formula 2, and the metal halide satisfies Chemical Formula 3:

AX      (Chemical Formula 2)

(in Chemical Formula 2, A is a monovalent organic ammonium ion, a monovalent ammonium ion or $Cs^+$, and X is a halogen ion), and $MX_2$      (Chemical Formula 3)

(in Chemical Formula 3, M is a divalent metal ion, and X is a halogen ion).

4. The method of claim 1, wherein the non-stoichiometric ratio satisfies the following Correlation Equation 1:

$1 < M_o/M_m \leq 1.5$      (Correlation Equation 1)

(in Correlation Equation 1, $M_o$ is a mole number of the organic halide contained in the light absorber solution, and $M_m$ is a mole number of the metal halide contained in the light absorber solution).

5. The method of claim 1, wherein the non-stoichiometric ratio satisfies the following Correlation Equation 2:

$1 < M_o/M_m < 1.25$      (Correlation Equation 2)

(in Correlation Equation 2, $M_o$ is a mole number of the organic halide contained in the light absorber solution, and $M_m$ is a mole number of the metal halide contained in the light absorber solution).

6. The method of claim 1, wherein step a) includes forming the first electrode on a rigid substrate or flexible substrate.

7. The method of claim 1, wherein application of the light absorber solution is performed by spin coating.

8. The method of claim 1, wherein application of the light absorber solution is performed at least two times by spin coating.

* * * * *